(12) United States Patent
Miyagawa

(10) Patent No.: US 9,466,641 B2
(45) Date of Patent: Oct. 11, 2016

(54) SOLID-STATE IMAGING DEVICE

(71) Applicant: PANASONIC CORPORATION, Osaka (JP)

(72) Inventor: Ryohei Miyagawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 84 days.

(21) Appl. No.: 14/098,115

(22) Filed: Dec. 5, 2013

(65) Prior Publication Data

US 2014/0091368 A1 Apr. 3, 2014

Related U.S. Application Data

(63) Continuation of application No. PCT/JP2012/004029, filed on Jun. 21, 2012.

(30) Foreign Application Priority Data

Jun. 22, 2011 (JP) ................................. 2011-138144

(51) Int. Cl.
*H01L 29/768* (2006.01)
*H01L 27/148* (2006.01)
(Continued)

(52) U.S. Cl.
CPC ....... *H01L 27/14806* (2013.01); *H01L 21/761* (2013.01); *H01L 27/14603* (2013.01);
(Continued)

(58) Field of Classification Search
CPC .................. H01L 27/14603; H01L 27/14643; H01L 27/14654; H01L 27/14656; H01L 27/14806
See application file for complete search history.

(56) References Cited

U.S. PATENT DOCUMENTS 7,247,899 B2 * 7/2007 Kuwabara ........... H01L 27/1463
257/292
7,728,277 B2 * 6/2010 Stevens ............. H01L 27/14609
250/214 DC
(Continued)

FOREIGN PATENT DOCUMENTS

JP 2001-230400 A 8/2001
JP 2007-201269 A 8/2007
(Continued)

OTHER PUBLICATIONS

International Search Report issued in PCT/JP2012/004029, dated Jul. 31, 2012.

*Primary Examiner* — Matthew Landau
*Assistant Examiner* — Stephen C Smith
(74) *Attorney, Agent, or Firm* — McDermott Will & Emery LLP

(57) ABSTRACT

A solid-state imaging device including: a semiconductor substrate of a first conductivity type, having a fixed electric potential; a dark-current drain region of a second conductivity type, formed on a portion of the semiconductor substrate; a connection region of the first conductivity type, formed on another portion of the semiconductor substrate where the dark-current drain region is not formed; a well region of the first conductivity type, covering the dark-current drain region and the connection region; and a first region and a second region, formed within the well region and constituting a part of a read transistor that reads signal charge generated by photoelectric conversion. The well region is maintained at a fixed electric potential by being connected to the semiconductor substrate via the connection region.

12 Claims, 16 Drawing Sheets

(51) Int. Cl.
*H01L 27/146* (2006.01)
*H01L 21/761* (2006.01)
*H01L 29/66* (2006.01)
*H01L 29/78* (2006.01)

(52) U.S. Cl.
CPC ... *H01L27/14643* (2013.01); *H01L 27/14654* (2013.01); *H01L 29/66795* (2013.01); *H01L 29/785* (2013.01)

(56) References Cited

U.S. PATENT DOCUMENTS

| | | | |
|---|---|---|---|
| 7,875,916 B2* | 1/2011 | Stevens | H01L 27/14609 257/233 |
| 2001/0012133 A1 | 8/2001 | Yoneda et al. | |
| 2005/0185074 A1 | 8/2005 | Yoneda et al. | |
| 2006/0011952 A1* | 1/2006 | Ohkawa | H01L 27/14609 257/291 |
| 2007/0045668 A1* | 3/2007 | Brady | H01L 27/14603 257/219 |
| 2007/0177044 A1 | 8/2007 | Maruyama et al. | |
| 2008/0138926 A1* | 6/2008 | Lavine | H01L 27/14632 438/59 |
| 2008/0246107 A1 | 10/2008 | Maehara | |
| 2009/0073291 A1 | 3/2009 | Yoneda et al. | |
| 2010/0002113 A1* | 1/2010 | Ota | H01L 27/14632 348/297 |
| 2011/0049336 A1* | 3/2011 | Matsunuma | H01L 27/14609 250/214.1 |
| 2011/0069358 A1 | 3/2011 | Yoneda et al. | |
| 2011/0157440 A1 | 6/2011 | Yoneda et al. | |
| 2012/0281262 A1 | 11/2012 | Yoneda et al. | |

FOREIGN PATENT DOCUMENTS

| | | |
|---|---|---|
| JP | 2008-252004 A | 10/2008 |
| JP | 2011-222708 A | 11/2011 |
| JP | 2011-222876 A | 11/2011 |

* cited by examiner

900

SOLID-STATE IMAGING DEVICE

CROSS REFERENCE TO RELATED APPLICATION

This is a continuation application of PCT Application No. PCT/JP2012/004029 filed Jun. 21, 2012, designating the United States of America, the disclosure of which, including the specification, drawings and claims, is incorporated herein by reference in its entirety.

TECHNICAL FIELD

The present disclosure relates to a solid-state imaging device, and in particular to a technology of fixing the electric potential of a well region.

BACKGROUND ART

A solid-state imaging device 900 shown in FIG. 16 is an example of conventional solid-state imaging devices. The solid-state imaging device 900 has a pixel region where pixels are two-dimensionally arrayed, and a peripheral region surrounding the pixel region. The solid-state imaging device 900 also has: a P-type (first conductivity type) well region 910; an N-type (second conductivity type) photodiodes 912, which are photoelectric converters formed within the well region 910; P$^+$-type (first conductivity type with a high concentration of impurities) doped regions 914, which are formed within the well region 910; insulating films 920 and 930, which are layered on the well region 910; and light-shielding films 940, which are made of metal and are formed on the regions of the insulating film 930 respectively corresponding to the doped regions 914. Although not depicted in the drawing, a reset transistor and an amplifying transistor are formed within the well region 910.

Here, if the well region 910 is charged from the peripheral region of the solid-state imaging device 900, the electric potential of the well region 910 could be non-uniform due to the resistance of the well region 910. Specifically, the central region of the well region 910 could have a lower electric potential than the peripheral region. The well region 910 serves as the back gate of the transistors. Therefore, if the electric potentials of the pixels in the well region 910 are different, the maximum amount of electric charge that can be accumulated in the photodiodes 912 could vary among the pixels even with the same amount of incident light. Consequently, the output signals could be different among the pixels, and shading could occur in the image. In order to prevent this problem, in the solid-state imaging device 900, the light-shielding film 940 is held at a fixed potential, and the doped regions 914 and the light-shielding films 940 are electrically connected via well contact regions 922. Thus, the electric potential of the well region 910 is made stable at every pixel.

There is another problem that electrical charge generated in the well region 910 due to thermal excitation could cause dark current. In order to prevent the dark current from entering the photodiodes 912, the P-type (first conductivity type) well region 910 is formed on an N-type (second conductivity type) substrate connected to a power supply voltage, for example. When the N-type (second conductivity type) substrate has a higher electric potential than the well region 910, the dark current generated in the well region 910 flows out to the substrate having a higher electric potential than the well region 910.

CITATION LIST

Patent Literature

[Patent Literature 1] Japanese Patent Application Publication No. 2001-230400

SUMMARY

Technical Problem

In the above-described conventional solid-state imaging device, the gates of the transistors can be located only on the regions within the insulating films where the well contact regions are not formed. Therefore, the widths of the transistors are inevitably small, which can be a cause of noise.

For example, if the area of the gate of an amplifying transistor is reduced, Random Telegraph Signal (RTS) noise will increase because RTS noise increases in inverse proportion to the area of the gate. Also, if the width of the channel of an amplifying transistor is reduced, the mutual conductance will decrease because the mutual conductance is proportional to the width of the channel. If the mutual conductance decreases, the amount of the drain current will be smaller even at the same gate voltage. This lowers the speed of reading the electric signal charge. Furthermore, if the length of the gate of a reset transistor is small, the punch-through phenomenon could occur. If the electric charge from the source flows directly to the drain due to the punch-through phenomenon and does not pass through the channel, the reset transistor cannot control the potential of the floating diffusion. Consequently, noise occurs.

Meanwhile, the doped region is formed within the well region in order to make the electric potential of the well region stable. Therefore, the photoelectric converter can be formed only on the region within the well region where the doped region is not formed, and the area of the photoelectric converter will be smaller compared to when the doped region is not formed. If the area of the photoelectric converter is small, there could be a problem that the amount of reception light will be small and the sensitivity will be low, or that the saturation capacity, which is the maximum amount of signal charge that can be accumulated, will be small and the dynamic range will be low.

Since pixels have been miniaturized in recent years, the light-shielding films and the well contact regions have relatively large areas, and there is a stronger demand than ever for the solution to the above-described problem.

The present invention is made to solve the above-described problems, and aims to provide a solid-state imaging device capable of stabilizing the electric potential of the well region without limiting the regions for forming the photoelectric converter and the transistors.

Solution to Problem

To solve the problems described above, the present disclosure provides a solid-state imaging device comprising: a semiconductor substrate of a first conductivity type, having a fixed electric potential; a dark-current drain region of a second conductivity type, formed on a portion of the semiconductor substrate; a connection region of the first conductivity type, formed on another portion of the semiconductor substrate where the dark-current drain region is not formed; a well region of the first conductivity type, covering the dark-current drain region and the connection region; and a first region and a second region, formed within the well region and constituting a part of a read transistor that reads signal charge generated by photoelectric conversion, the first region and the second region respectively serving as a source region and a drain region of the read transistor, wherein the well region is maintained at a fixed electric potential by being connected to the semiconductor substrate via the connection region.

Advantageous Effects

According to the solid-state imaging device pertaining to the present disclosure, the electric potential of the well region is stable, because the well region is connected to the substrate, which is maintained at a fixed electric potential, via the connection region. Also, since the connection region is not formed on the regions where the gates of the transistors are to be formed or the well region where the photoelectric converter is to be formed, but are formed between the well region and the substrate. Therefore, the connection region does not limit the regions for the photoelectric converter and the transistors.

Thus, the solid-state imaging device pertaining to the present disclosure is capable of stabilizing the electric potential of the well region without limiting the regions for forming the photoelectric converter and the transistors.

DESCRIPTION OF EMBODIMENTS

Embodiment 1

1. Structure of Solid-State Imaging Device 100

Figure 1A:
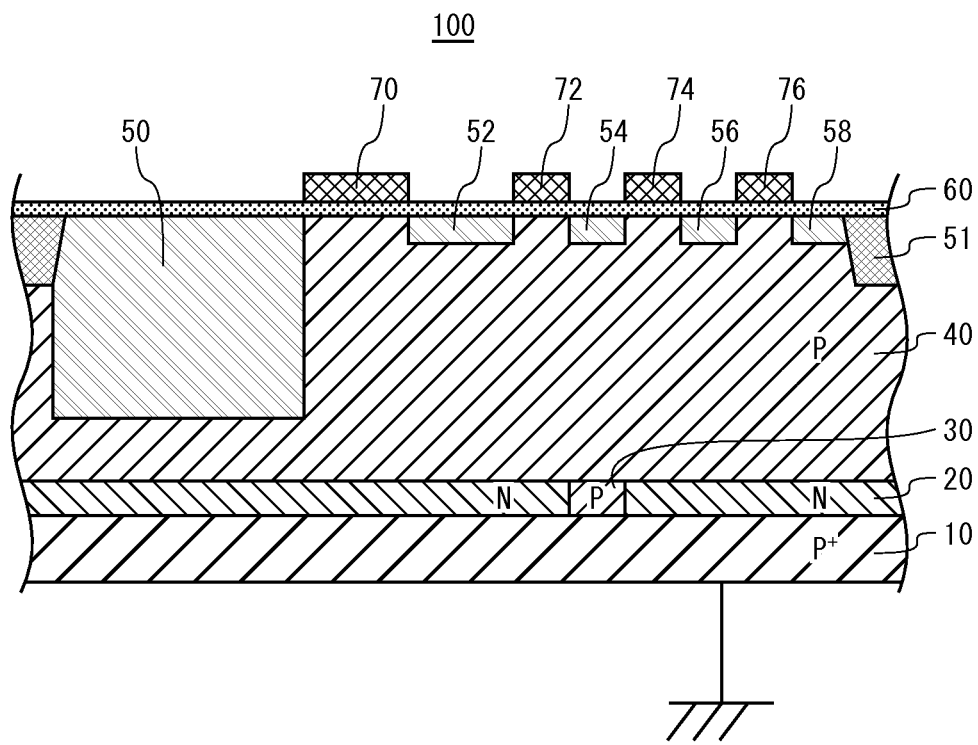
FIG. 1A is a cross-sectional view of a solid-state imaging device pertaining to Embodiment 1 of the present disclosure.
Figure 1B:
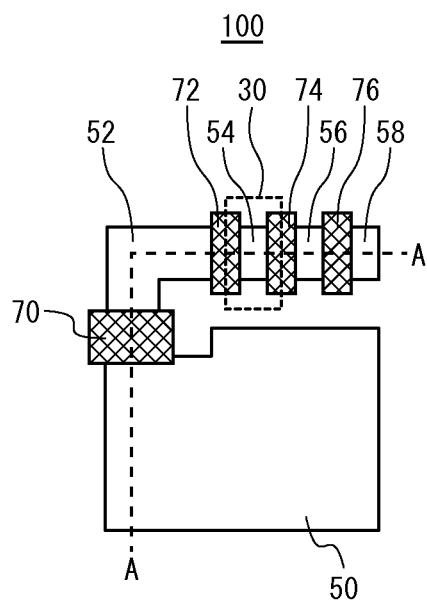
FIG. 1B is a layout diagram showing the positional relationship between transistors and a connection region.

FIG. 1A is a cross-sectional view of a solid-state imaging device 100 pertaining to Embodiment 1 of the present disclosure, and FIG. 1B is a layout diagram showing a modification example of the positional relationship between transistors and a connection region. Note that the cross section along the line A-A shown in the plan view of the solid-state imaging device 100 shown in FIG. 1B corresponds to FIG. 1A.

As shown in FIG. 1A, the solid-state imaging device 100 includes: a $P^+$-type (first conductivity type with a high concentration of impurities) silicon substrate 10; an N-type (second conductivity type) dark-current drain region 20 formed on the silicon substrate 10; a P-type (first conductivity type) connection region 30 formed on the region within the silicon substrate 10 where the dark-current drain region 20 are not formed; a P-type (first conductivity type) well region 40 formed over the dark-current drain region 20 and the connection region 30; and a gate oxide film 60 formed on the well region 40. In the following description, the dark-current drain region 20, the connection region 30 and the well region 40 are treated as being independent from the silicon substrate 10, and only the region of the $P^+$-type (first conductivity type with a high concentration of impurities) is referred to as silicon substrate 10. The silicon substrate 10 is connected to the ground, and the electric potential thereof is fixed. The silicon substrate 10 and the well region 40 are electrically connected via the connection region 30. The stabilization of the electric potential of the well region 40 will be described later in detail.

The solid-state imaging device 100 includes: an element isolation region 51 formed by Shallow Trench Isolation (STI); a photodiode 50 serving as the photoelectric converter; a floating diffusion 52; a read gate 70; a reset gate 72; an amplifying gate 74; and a select gate 76. The read gate 70 is formed adjacent to the photodiode 50, and the reset gate 72 is formed adjacent to the floating diffusion 52. A read transistor is composed of the photodiode 50, the read gate 70 and the floating diffusion 52. The photodiode 50 serves as a source region of the read transistor, and the floating diffusion 52 serves as a drain region of the read transistor. A reset transistor is composed of the floating diffusion 52, the reset gate 72 and a junction region 54. The floating diffusion 52 serves as a source region of the reset transistor, and the junction region 54 serves as a drain region of the reset transistor. An amplifying transistor is composed of the junction region 54, the amplifying gate 74 and a junction region 56. The junction region 54 serves as a drain region of the amplifying transistor, and the junction region 56 serves as a source region of the amplifying transistor. A select transistor is composed of the junction region 56, the select gate 76 and a junction region 58. The junction region 56 serves as a drain region of the select transistor, and the junction region 58 serves as a source region of the select transistor. The floating diffusion 52 is connected to the amplifying gate 74 via a metal wiring line.

The signal charge generated by photoelectric conversion by the photodiode 50 is read into the floating diffusion 52 by the read gate 70. The signal charge read into the floating diffusion 52 is amplified by the amplifying transistor. The floating diffusion 52 outputs the amplified signal charge according to an instruction from the select transistor. Upon the floating diffusion 52 outputs the signal charge, the reset transistor resets the electric potential of the floating diffusion 52.

The dark-current drain region 20 is connected to peripheral wiring lines via the N-type (second conductivity type) well region, for example, and the electric potential of the dark-current drain region 20 is fixed to 3.3 V, for example. The electric potential of the dark-current drain region 20 is therefore higher than the electric potential of the well region 40 fixed to the ground potential. The electric potential of the junction region 54, which serves as a drain of the reset transistor, is fixed to the power supply voltage.

2. Arrangement of Connection Regions in Solid-State Imaging Device 100

Electrical charge could be generated in the silicon substrate 10 and the well region 40 due to thermal excitation or the like, and the electrical charge could cause dark current. If the dark current enters the photodiode 50, the charge is output as signal charge and causes noise, and affects the characteristics of the solid-state imaging device 100. Therefore, the connection region 30 needs to be located so as not to overlap the photodiode 50. The signal charge read out of the photodiode 50 is temporarily accumulated in the floating diffusion 52. Therefore, to maintain the characteristics of the solid-state imaging device 100, it is also demanded to prevent the dark current from entering the floating diffusion 52. Therefore, it is preferable that the connection region 30 is located away from the floating diffusion 52.

As shown in FIG. 1B, in plan view of a single pixel of the solid-state imaging device 100, the connection region 30 is located to surround the junction region 54. The dark-current drain region 20 spreads over the area where the connection region 30 is not formed. That is, when a single pixel of the solid-state imaging device 100 is seen from above, the connection region 30 overlaps at least part of the reset transistor. The dark-current drain region 20, which is reverse-biased, is formed to cover the photodiode 50 and the floating diffusion 52. Since the dark-current drain region 20 has a higher electric potential than the silicon substrate 10, the dark current generated in the silicon substrate 10 flows from the silicon substrate 10 to the dark-current drain region 20, and the dark-current drain region 20 absorbs the dark current. Consequently, the dark-current drain region 20 prevents the dark current from entering the photodiode 50 and the floating diffusion 52.

Meanwhile, if a portion of the dark current generated in the silicon substrate 10 flows into the well region 40 via the connection region 30, the junction region 54 absorbs almost the entire portion. This is because the electric potential of the junction region 54 fixed to the power supply voltage is higher than the electric potential of the well region 40, and the junction region 54 is likely to absorb the dark current.

Thus, it is possible to prevent the dark current from entering the photodiode 50 and the floating diffusion 52 by locating the connection region 30 to surround the junction region 54 in plan view. To suppress dark current generated in the silicon substrate 10 and entering the well region 40, it is preferable that the connection region 30 and the element isolation region 51 are located such that, in plan view, the connection region 30 overlaps an active region of the pixel rather than the element isolation region 51. The active region includes, for example, the sources, the drains and the channels of the transistors within the pixel. In particular, it is preferable that, in plan view, the connection region 30 overlaps the regions serving as the source region or the drain region which are always reverse-biased, because the connection region 30 having such a structure is more likely to absorb the dark current.

3. Material and Dimension of Solid-State Imaging Device 100

In the solid-state imaging device 100, each pixel has the shape of a 1.19 μm square, and the connection region 30 is ⅓ to ½ of the pixel in size, and has the shape of 0.4 μm to 0.6 μm square. To reduce the amount of the dark current flowing from the silicon substrate 10 to the connection region 30, it is preferable that the connection region 30 is as small as possible.

Figure 2:
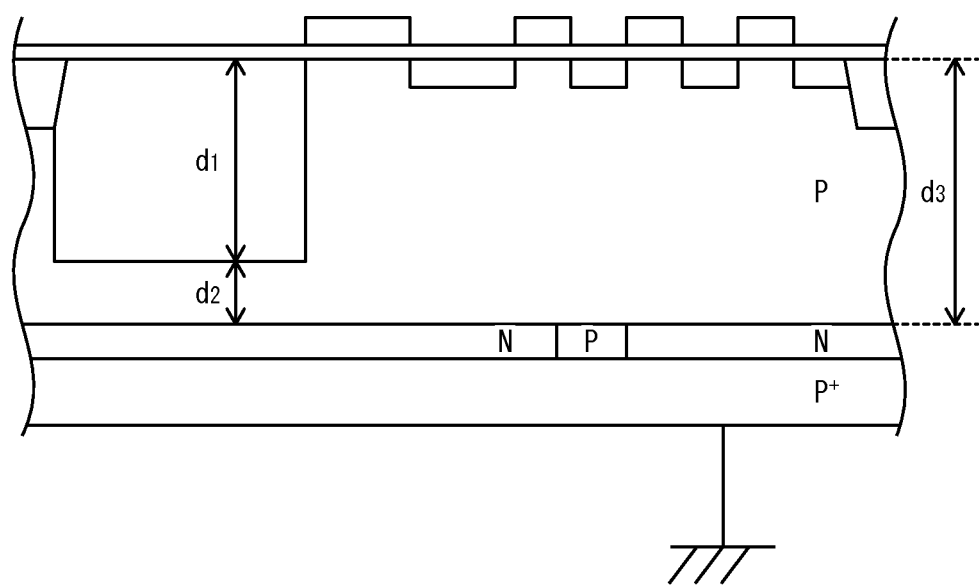
FIG. 2 is a dimensional drawing of the solid-state imaging device shown in FIGS. 1A and 1B.

With respect to the depth, as shown in FIG. 2, the depth d1 of the photodiode 50 is from 2 μm to 4 μm for example, and the distance d2 between the photodiode 50 and the dark-current drain region 20 is from 0.5 μm to 1 μm, for example. The film thickness d3 of the well region 40 is from 2.5 μm to 5 μm for example, and 3 μm is particularly preferable.

The silicon substrate 10 is a P-type silicon substrate with a high concentration of impurities, and the use of a P-on-P$^+$ substrate is preferable, which is formed by for example layering a P-type epilayer with a low concentration of impurities on a P$^+$-type substrate with a very high concentration of impurities. This is because a P$^+$-type region with a low resistance and a high concentration of impurities is unlikely to generate dark current. A P$^+$-type region has a very high hole concentration, and the occurrence rate of electrons as the minority carriers is low.

The well region 40 is a P-type (first conductivity type) epilayer with a low impurity concentration. The dark-current drain region 20 is an N-type (second conductivity type) impurity layer. The impurity concentration of the dark-current drain region 20 is set within the range where the dark-current drain region will not be depleted. The range is, for example, 5E16 atoms/cm$^3$ to 5E17 atoms/cm$^3$.

4. Method of Manufacturing Solid-State Imaging Device 100

The following explains a method of manufacturing the solid-state imaging device 100 pertaining to Embodiment 1 of the present disclosure. In particular, the steps of manufacturing the dark-current drain region 20 and the connection region 30 as principal parts of the solid-state imaging device 100 are explained with reference to FIGS. 3A through 3C and 4A and 4B. Note that explanation of the steps of manufacturing the element isolation region 51 and the transistors are omitted.

Figure 3A:
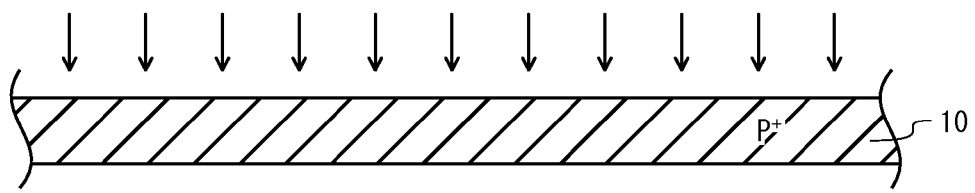
FIGS. 3A through 3C show steps for manufacturing the solid-state imaging device shown in FIGS. 1A and 1B.

As shown in FIG. 3A, N-type ion implantation is performed on the entire area of the P$^+$-type silicon substrate 10. Specifically, the ion implantation is performed with P$^+$ atomic ions at the acceleration energy of 170 KeV and the implantation amount of 1E12 atoms/cm$^2$ to 1E13 atoms/cm$^2$, for example.

Figure 3B:
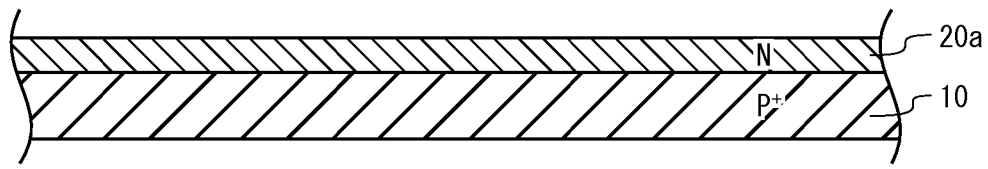

By the ion implantation described above, a dark-current drain material 20a, consisting of an N-type impurity layer, is formed on the P+-type silicon substrate 10 with a high concentration of impurities as shown in FIG. 3B.

Figure 3C:
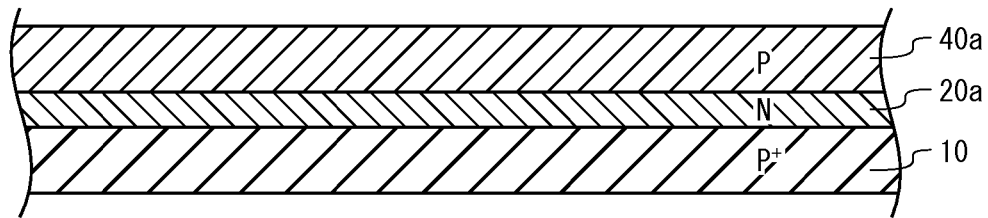

As shown in FIG. 3C, a P-type (first conductivity type) epilayer 40a is formed on the dark-current drain material 20a by causing epitaxial growth. Specifically, the epilayer 40a with the film thickness of 3 μm for example is formed on the silicon substrate 10 with the dark-current drain material 20a interposed between them.

Figure 4A:
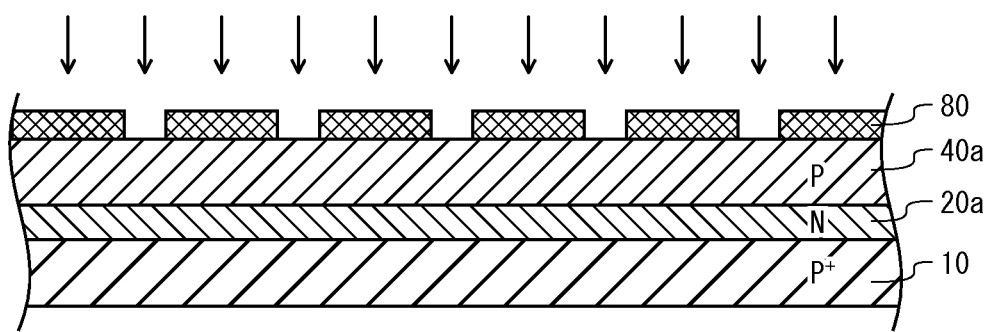
FIGS. 4A and 4B show steps for manufacturing the solid-state imaging device shown in FIGS. 1A and 1B.

Next, as shown in FIG. 4A, P-type (first conductivity type) ion implantation is performed with the use of a resist 80 as a mask. Specifically, the resist 80 is formed on the epilayer 40a by lithography technology, and the ion implantation is performed with B+ atomic ions at the acceleration energy of 3.0 MeV and the implantation amount of 1E12 atoms/cm² to 1E13 atoms/cm², for example.

Figure 4B:
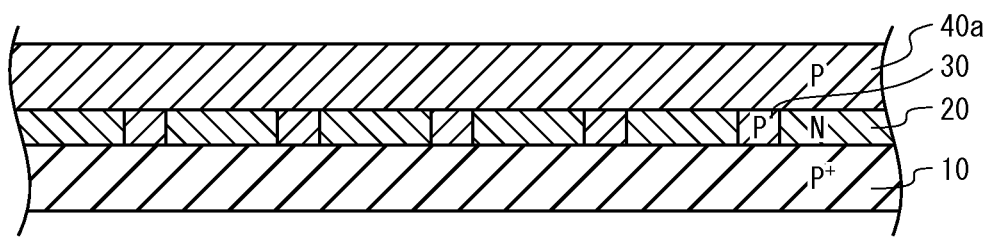

By the ion implantation described above, the N-type (second conductivity type) dark-current drain region 20 and the P-type (first conductivity type) connection region 30 are formed on the silicon substrate 10 as shown in FIG. 4B. After that, the element isolation region 51, the well region 40, the transistors within the pixel as described above, and the photodiode 50 are formed.

5. Effects

The well region 40 is connected to the silicon substrate 10 maintained at the fixed electric potential via the connection region 30. Therefore, the electric potential of the well region 40 is stable. This structure prevents the shading due to the difference in electric potential among the pixels within the well region 40. In particular, since the connection region 30 is formed for each pixel and the electric potential of the well region 40 is made uniform for each pixel, the photodiode 50 of each pixel can achieve the same maximum amount of electric charge accumulation.

Furthermore, since each connection region 30 is formed between the well region 40 and the silicon substrate 10, not in the regions where the photodiode 50 is formed or in the regions where the gates of the transistors are formed. Therefore, the connection region 30 does not limit the regions where the photodiode 50 and the transistors can be formed. Thus, there is a sufficient area for forming the photodiode 50 and the transistors.

By locating the photodiode 50 and the connection region 30 so as to be two-dimensionally away from each other, the dark current flowing from the silicon substrate 10 to the connection region 30 is prevented from entering the photodiode 50. Also, since the junction region 54 absorbs the dark current flowing from the silicon substrate 10 to the well region 40 via the connection region 30, the dark current is prevented from entering the photodiode 50 and the floating diffusion 52.

In addition, according to the method described above, the ion implantation is performed on the entire area of the silicon substrate 10 at the stage of forming the dark-current drain region 20 on the silicon substrate 10. Therefore, it is unnecessary to perform patterning of the resist, and it is unnecessary to form the marks for photolithography on the silicon substrate 10 at this stage. Consequently, the method described above can reduce the number of the required steps.

Embodiment 2

1. Structure of Solid-State Imaging Device 200

Figure 5A:
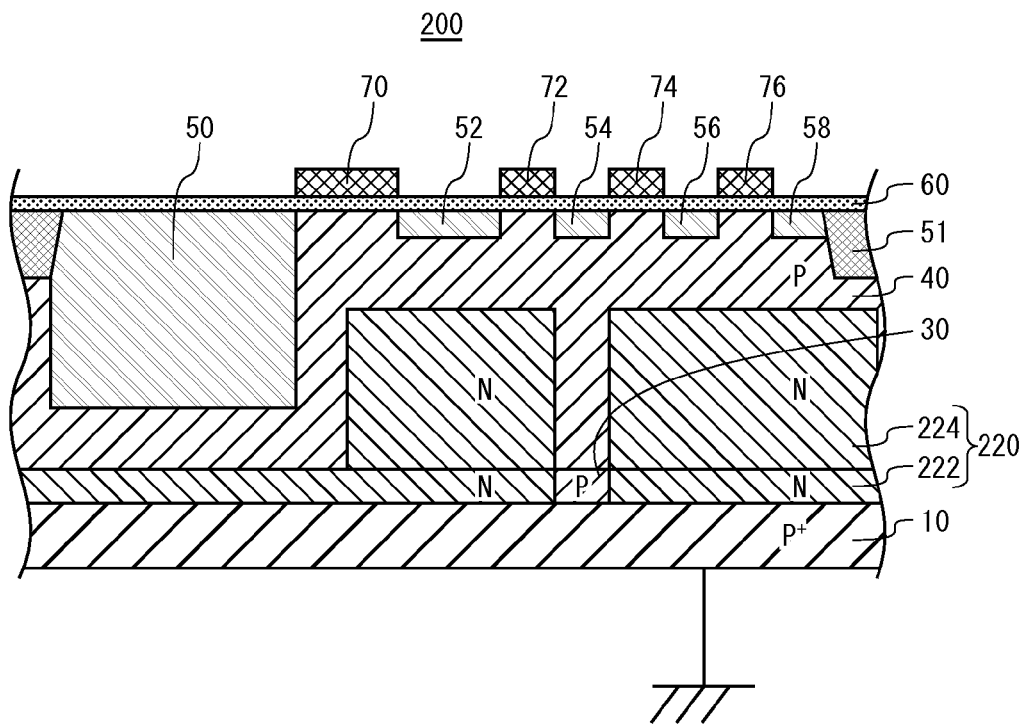
FIG. 5A is a cross-sectional view of a solid-state imaging device pertaining to Embodiment 2 of the present disclosure.
Figure 5B:
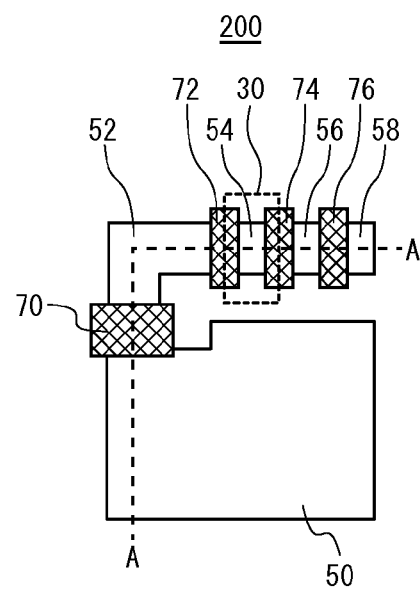
FIG. 5B is a layout diagram showing the positional relationship between transistors and a connection region.

FIG. 5A is a cross-sectional view of a solid-state imaging device 200 pertaining to Embodiment 2 of the present disclosure, and FIG. 5B is a layout diagram showing the positional relationship between the transistors and the connection region. The solid-state imaging device 200 has the same elements as the solid-state imaging device 100 except for the elements described below, and explanation of the same elements is therefore omitted.

As shown in FIG. 5A, the solid-state imaging device 200 includes a dark-current drain region 220 composed of a first dark-current drain region 222 and a second dark-current drain region 224. The section corresponding in position to the photodiode 50 includes the first dark-current drain region 222, but does not include the second dark-current drain region 224. The top surface of the first dark-current drain region 222 is at a greater depth than the bottom surface of the photodiode 50, and the top surface of the second dark-current drain region 224 is at a smaller depth than the bottom surface of the photodiode 50. That is, the second dark-current drain region 224 is formed within the well region 40 at a smaller depth than the first dark-current drain region 222 such that the second dark-current drain region 224 does not overlap the photodiode 50 in plan view.

As shown in FIG. 5B, in plan view of the solid-state imaging device 200 as with the solid-state imaging device 100, the connection region 30 is located to surround the junction region 54, and the dark-current drain region 220 spreads over the area where the connection region 30 is not formed.

2. Method of Manufacturing Solid-State Imaging Device 200

Figure 6A:
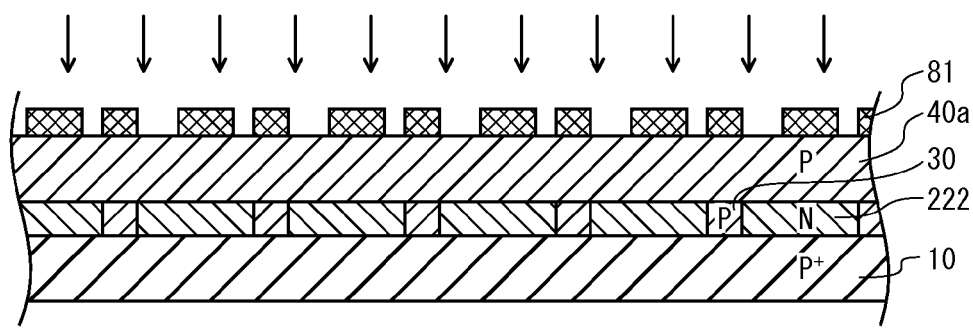
FIGS. 6A and 6B show steps for manufacturing the solid-state imaging device shown in FIGS. 5A and 5B.
Figure 6B:
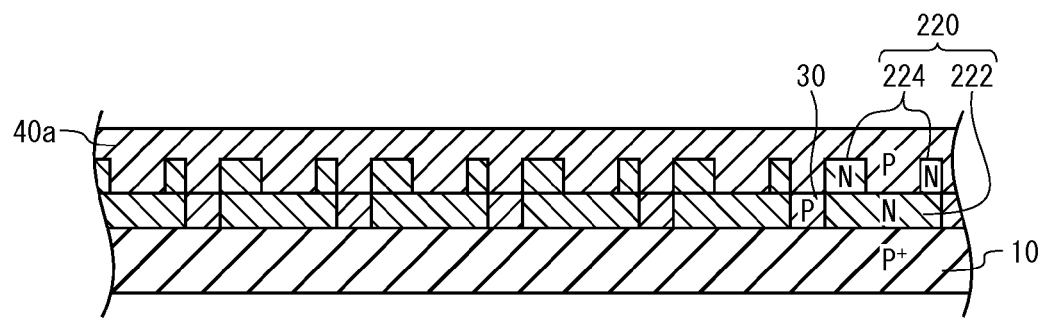

The following describes principle steps of a method of manufacturing the solid-state imaging device 200 with reference to FIGS. 6A and 6B, focusing on the difference from the solid-state imaging device 100.

After forming the connection region 30 and the first dark-current drain region 222 on the silicon substrate 10 by the same steps as those shown in FIGS. 3A through 4B, N-type (second conductivity type) ion implantation is performed with the use of a resist 81 as a mask as shown in FIG. 6A. Specifically, the resist 81 is formed on the epilayer 40a by lithography technology, and N-type (second conductivity type) ion implantation is performed with the use of the resist 81 as a mask. The ion implantation is performed with P+ atomic ions at the acceleration energy of 1 MeV and the implantation amount of 1E12 atoms/cm², for example.

By the ion implantation described above, the dark-current drain region 220 consisting of the first dark-current drain region 222 and the second dark-current drain region 224 are formed on the silicon substrate 10 as shown in FIG. 6B.

3. Effects

The second dark-current drain region 224 is located near the photodiode 50 and the floating diffusion 52, and the dark current generated in the well region 40 is likely to be absorbed by the second dark-current drain region 224. Consequently, the dark current is more effectively prevented from entering the photodiode 50 and the floating diffusion 52 compared to Embodiment 1.

Embodiment 3

1. Structure of Solid-State Imaging Device 300

Figure 7A:
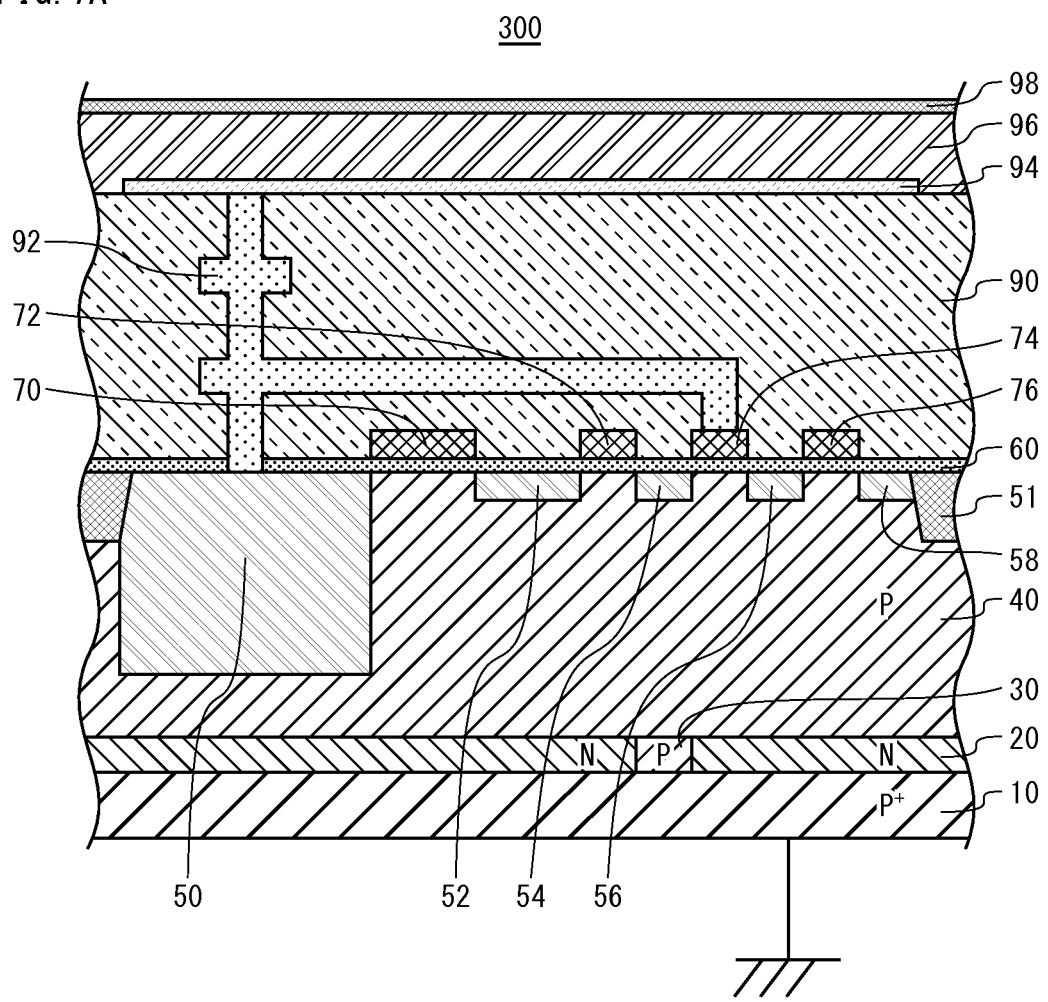
FIG. 7A is a cross-sectional view of a solid-state imaging device pertaining to Embodiment 3 of the present disclosure.
Figure 7B:
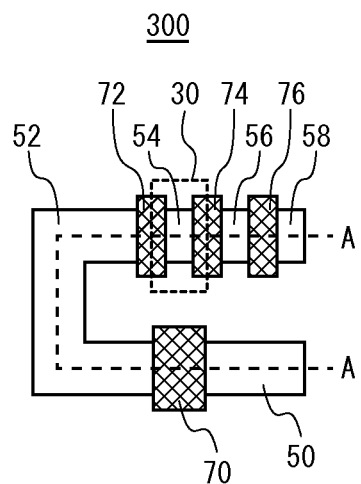
FIG. 7B is a layout diagram showing the positional relationship between transistors and a connection region.

FIG. 7A is a cross-sectional view of a solid-state imaging device 300 pertaining to Embodiment 3 of the present disclosure, and FIG. 7B is a layout diagram showing the positional relationship between transistors and a connection region. The solid-state imaging device 300 has the same elements as the solid-state imaging device 100 except for the elements described below, and explanation of the same elements is therefore omitted.

As shown in FIG. 7A, the solid-state imaging device 300 includes: an insulating film 90 which is formed to cover the gate oxide film 60 and in which a connection layer 92 is embedded, the connection layer being composed of a contact region, a plurality of metal wiring lines, and a via; a lower electrode 94 formed on the insulating film 90, a photoelectric conversion film 96 spreading to cover the lower electrode 94; and an upper electrode 98 made of light-transmissive conductive material and covering the photoelectric conversion film 96. Although a wiring layer connected to the sources, the drains and the gates of the transistors is contained in the insulating film 90, the wiring layer is not depicted in the drawing except for the wiring connected to the gate 74 of the amplifying transistor.

The lower electrode 94 and the photodiode 50 are connected via the connection layer 92, and a bias voltage is applied across the upper electrode 98 and the lower electrode 94. Electrons generated within the photoelectric conversion film 96 by photoelectric conversion are attracted to the lower electrode 94 due to the bias voltage, pass through the lower electrode 94 and the connection layer 92, and accumulate in the photodiode 50. The photodiode 50 is connected to the gate 74 of the amplifying transistor. The electrons accumulated in the photodiode 50 are amplified by the amplifying transistor, and are taken out as a signal charge.

The insulating film 90 is made of silicon oxide for example, and the lower electrode 94 is made of Ti, Ta, W, TiN, or TaN for example. The photoelectric conversion film 96 is made of amorphous silicon, oxide semiconductor, or organic semiconductor for example, and the upper electrode 98 is made of light-transmissive conductive material such as ITO (Indium Tin Oxide) for example.

As shown in FIG. 7B, in plan view of the solid-state imaging device 300, the connection region 30 is located to surround the junction region 54, and the dark-current drain region 20 spreads over the area where the connection region 30 is not formed.

2. Effects

Despite the photoelectric conversion film 96, the solid-state imaging device 300 can achieve the same effects as the solid-state imaging device 100. Furthermore, since the photoelectric conversion film 96 is formed across the entire upper surface of the insulating film 90 containing the wiring, the aperture ratio reaches 100%, and the sensitivity of the solid-state imaging device 300 is improved.

Embodiment 4

1. Structure of Solid-State Imaging Device 400

Figure 8A:
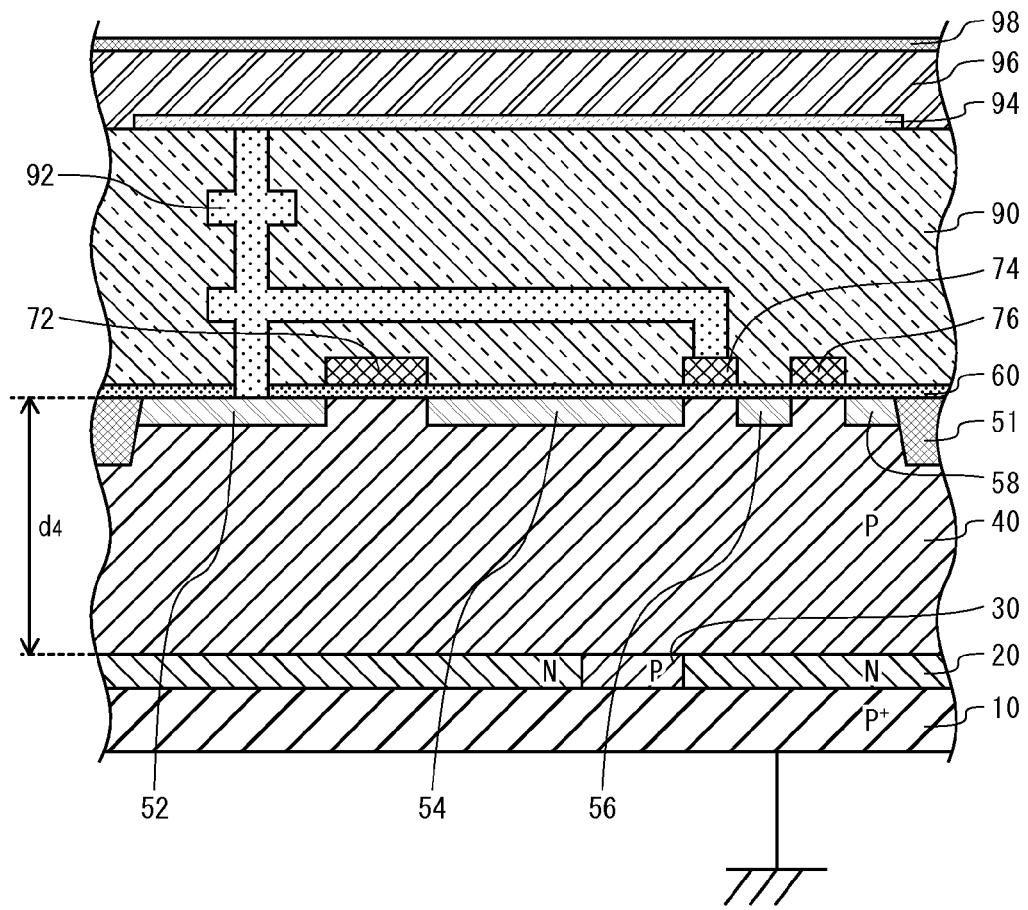
FIG. 8A is a cross-sectional view of a solid-state imaging device pertaining to Embodiment 4 of the present disclosure.

FIG. 8A is a cross-sectional view of a solid-state imaging device 400 pertaining to Embodiment 4 of the present disclosure, and FIG. 7B is a layout diagram showing the positional relationship between transistors and a connection region. The solid-state imaging device 400 has the same elements as the solid-state imaging device 100 except for the elements described below, and explanation of the same elements is therefore omitted.

As shown in FIG. 8A, the solid-state imaging device 400 includes: an insulating film 90 which is formed to cover the gate oxide film 60 and in which a connection layer 92 is embedded, the connection layer being composed of a contact region, a plurality of metal wiring lines, and a via; a lower electrode 94 formed on the insulating film 90, a photoelectric conversion film 96 spreading to cover the lower electrode 94; and an upper electrode 98 made of light-transmissive conductive material and covering the photoelectric conversion film 96. The present embodiment is different from the embodiments described above in that the photoelectric conversion film 96 performs photoelectric conversion.

The connection region 30 is formed to overlap the junction region 54 in plan view. To prevent the dark current from the silicon substrate 10 and the dark current generated in the well region 40 from entering the floating diffusion 52, it is preferable that the dark-current drain region 20 is located close to the floating diffusion 52. Specifically, it is preferable that the distance d4 between the top surface of the dark-current drain region 20 and the top surface of the well region 40 falls within the range of 0.3 µm to 1 µm, for example.

The lower electrode 94 and the floating diffusion 52 are connected via the connection layer 92, and a bias voltage is applied across the upper electrode 98 and the lower electrode 94. Electrons generated within the photoelectric conversion film 96 by photoelectric conversion are attracted to the lower electrode 94 due to the bias voltage, pass through the lower electrode 94 and the connection layer 92, and accumulate in the floating diffusion 52. The floating diffusion 52 is connected to the gate 74 of the amplifying transistor. The electrons accumulated in the floating diffusion 52 are amplified by the amplifying transistor, and are taken out as a signal charge.

Figure 8B:
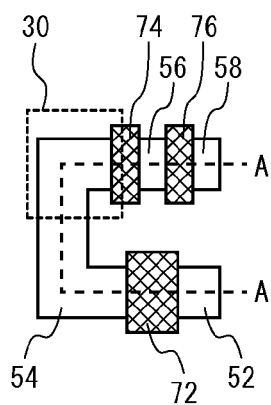
FIG. 8B is a layout diagram showing the positional relationship between transistors and a connection region.

As shown in FIG. 8B, in plan view of the solid-state imaging device 400, the connection region 30 is formed to surround the junction region 54.

In the solid-state imaging device 400, the signal charge is accumulated in the floating diffusion 52. Therefore, the solid-state imaging device 400 has a structure for preventing the dark current flowing from the silicon substrate 10 from entering the floating diffusion 52. That is, the dark-current drain region 20 is formed to overlap the floating diffusion 52 in plan view, so that the dark current from the silicon substrate 10 is prevented from entering the floating diffusion 52. The connection region 30 is formed not to overlap the floating diffusion 52, but to overlap the sources or the drains of the transistors.

2. Effects

Despite the photoelectric conversion film 96, the solid-state imaging device 400 can achieve the same effects as the solid-state imaging device 100. Also, since the solid-state imaging device 400 does not have a photodiode, the dark-current drain region 20 and the connection region 30 can be formed at a smaller depth in the silicon substrate 10 when compared with the solid-state imaging device 100. The pixels can be miniaturized because the space for a photodiode is saved, and the number of the pixels can be increased. Furthermore, since the photoelectric conversion film 96 is formed across the entire upper surface of the insulating film 90 containing the wiring, the aperture ratio reaches 100%, and the sensitivity of the solid-state imaging device 400 is improved.

Embodiment 5

1. Structure of Solid-State Imaging Device 500

Figure 9A:
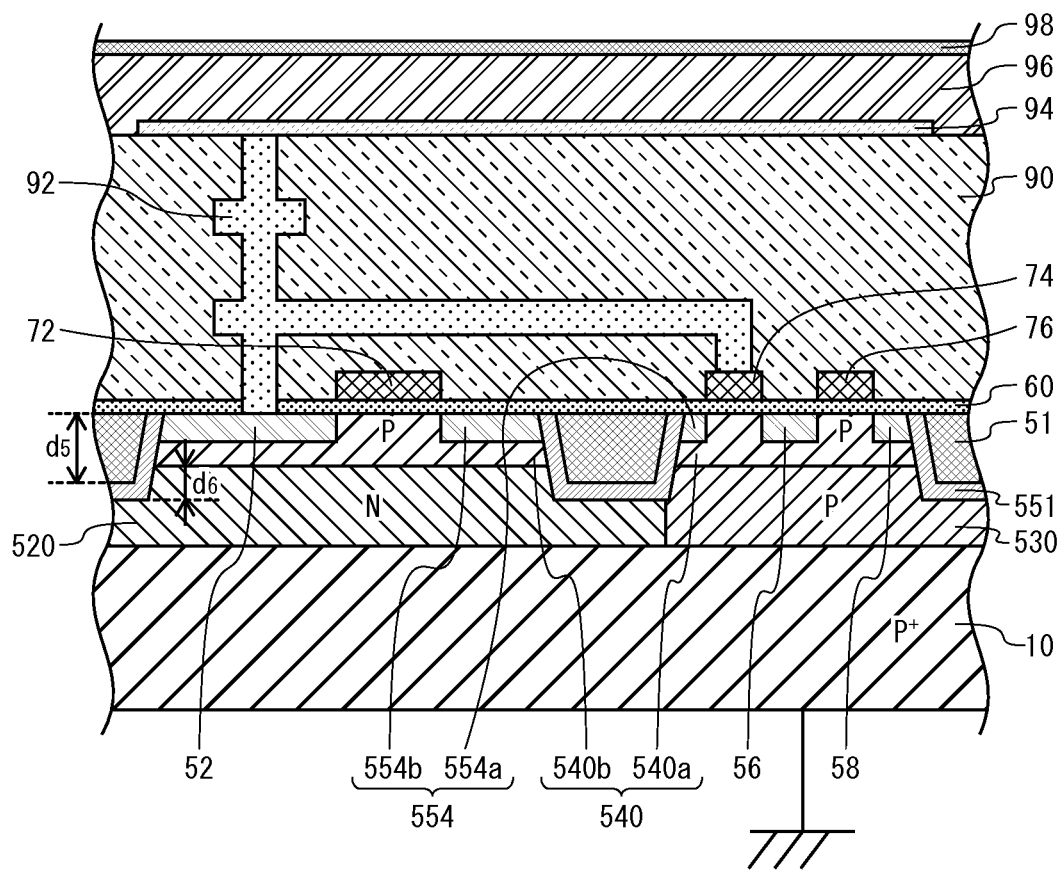
FIG. 9A is a cross-sectional view of a solid-state imaging device pertaining to Embodiment 5 of the present disclosure.
Figure 9B:
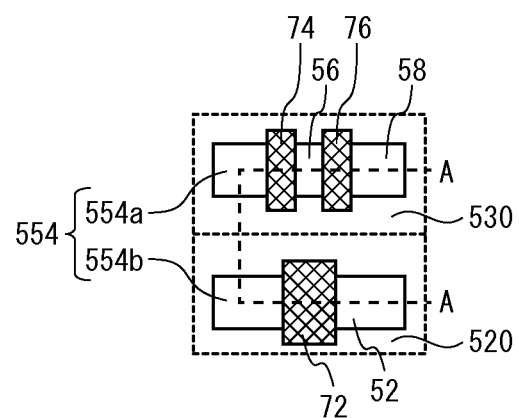
FIG. 9B is a layout diagram showing the positional relationship between transistors and a connection region.

FIG. 9A is a cross-sectional view of a solid-state imaging device 500 pertaining to Embodiment 5 of the present disclosure, and FIG. 9B is a layout diagram showing the positional relationship between transistors and a connection region. The solid-state imaging device 500 has the same elements as the solid-state imaging device 400 except for the elements described below, and explanation of the same elements is therefore omitted.

As shown in FIG. 9A, when compared with the solid-state imaging device 400, a dark-current drain region 520 and a connection region 530 of the solid-state imaging device 500 are located at a lower depth. The dark-current drain region 520 is connected to the element isolation region 51 via the junction region 551. The junction region 554 includes junction region portions 554a and 554b separated by the element isolation region 51. Thus, the floating diffusion 52, which serves as the source region of the reset transistor, is surrounded by the element isolation region 51 and the dark-current drain region 520 in plan view. This structure prevents the dark current from flowing from the silicon substrate 10 to the floating diffusion 52. Also, since the dark-current drain region 520 is located at a low depth and adjacent to the floating diffusion 52, the structure prevents the dark current generated in the well region 540 from entering the floating diffusion 52.

The P-type (first conductivity type) well region 540 is separated by the element isolation region 51 and the N-type (second conductivity type) dark-current drain region 520, and a well region portion 540b near the floating diffusion 52 is separated from the other well region portion 540a.

Since the well region portion 540a is in contact with the connection region 530, the electric potential of the well region 540a is stable. On the other hand, the well region 540b is not in contact with the connection region 530. Therefore, to make the electric potential of the well region 540b stable, a P-type (first conductivity type) junction region 551 is formed around the element isolation region 51. Since the well region portions 540a and 540b are connected via the junction region 551, the electric potentials of the well region portions 540a and 540b are stable.

The dark-current drain region 520 needs to be connected to the element isolation region 51 and to be located so as not to cause the punch-through phenomenon with the floating diffusion 52. Specifically, when the height d5 of the element isolation region 51 is 0.3 μm for example, the distance d6 from the boundary surface between the dark-current drain region 520 and the junction region 551 to the well region portion 540b preferably falls within the range of 0.2 μm to 0.3 μm.

As shown in FIG. 9B, in plan view of the solid-state imaging device 500, the connection region 530 is located to surround the junction regions 56, 58, and the junction region portion 554a, and the dark-current drain region 520 spreads over the area where the connection region 530 is not formed.

In the solid-state imaging device 500, the floating diffusion 52 is entirely surrounded by the dark-current drain region 520 and the element isolation region 51, and the dark current flowing from the silicon substrate 10 to the connection region 530 does not enter the floating diffusion 52. Therefore, the connection region 530 can occupy a large area except for the area where the region where floating diffusion 52 is formed. Thus, the connection region 530 can be formed large so as to overlap the junction regions 56, 58, and the junction region portion 554a in plan view.

2. Method of Manufacturing Solid-State Imaging Device 500

The following explains a method of manufacturing the solid-state imaging device 500 pertaining to Embodiment 5 of the present disclosure. In particular, the steps of manufacturing the dark-current drain region 520 and the connection region 530 as principal parts of the solid-state imaging device 500 are explained with reference to FIGS. 10A through 10D. Note that explanation of the steps of manufacturing the element isolation region 51 and the transistors are omitted.

Figure 10A:
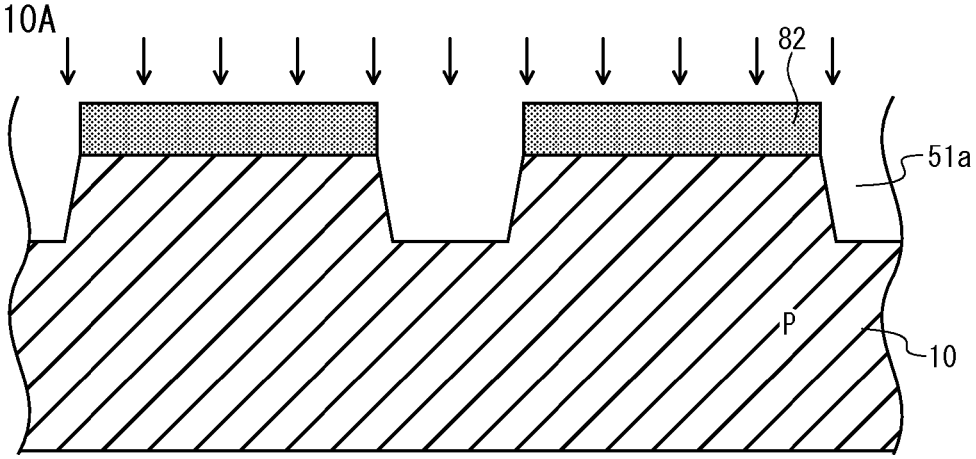
FIGS. 10A through 10D show steps for manufacturing the solid-state imaging device shown in FIGS. 9A and 9B.

As shown in FIG. 10A, P-type (first conductivity type) ion implantation is performed on the silicon substrate 10 having a groove 51a, with the use of a hard mask 82 as a mask. Specifically, etching is performed on the P-type (first conductivity type) silicon substrate 10 with the use of the hard mask 82 composed of two thin layers of $SiO_2$ and SiN. Thus the groove 51a serving as the element isolation region 51 is formed. Subsequently, P-type (first conductivity type) ion implantation is performed with the use of the hard mask 82. The ion implantation uses $B^+$ atomic ions at the acceleration energy of 20 KeV and the implantation amount of 4E13 atoms/$cm^2$, for example.

Figure 10B:
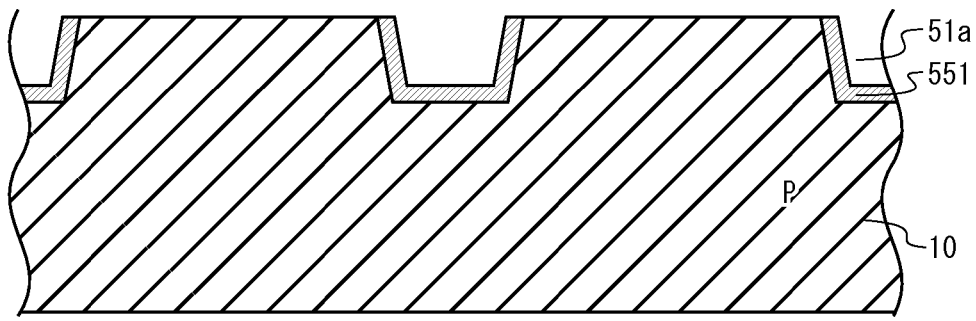

By the ion implantation described above, the junction region 551 is formed so as to coat the groove 51a as shown in FIG. 10B. After forming the base material of the junction region 551 by the P-type (first conductivity type) ion implantation, the groove 51a is embedded with a $SiO_2$ (silicon oxide) film for example. After that, the surface of the silicon substrate 10 is flattened by a Chemical Mechanical Polishing (CMP) technology. Thus the hard mask 82 is removed.

Figure 10C:
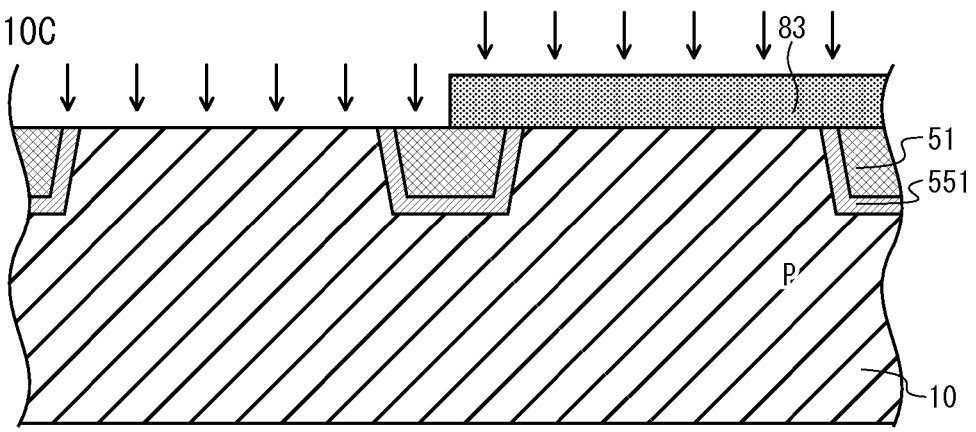

By the CMP technology described above, the element isolation region 51 is formed as shown in FIG. 10C. After that, N-type (second conductivity type) ion implantation is performed with the use of a resist 83 as a mask. Specifically, the resist 83 is formed by a photolithography technology, and N-type (second conductivity type) ion implantation is performed with $P^+$ ions or $As^+$ ions at the acceleration energy of 200 KeV for $P^+$ ions and 450 KeV for $As^+$ ions, and the implantation amount of 1E12 atoms/$cm^2$ to 1E13 atoms/$cm^2$, for example.

Figure 10D:
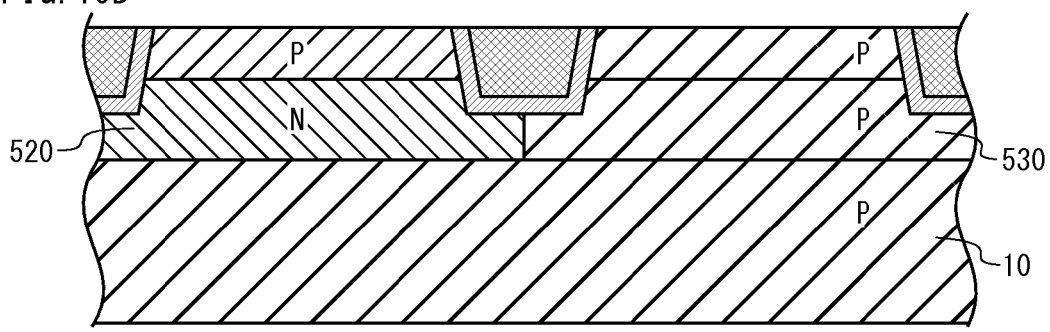

Thus the N-type (second conductivity type) dark-current drain region 520 is formed as shown in FIG. 10D. When the dark-current drain region 520 is formed, the region where is covered with the resist 83 and is not subject to the N-type (second conductivity type) ion implantation remains as a P-type (first conductivity type) region in the silicon substrate 10. This region serves as the connection region 530. Thus, the dark-current drain region 520 and the connection region 530 are formed. Specifically, the dark-current drain region 520 is formed by performing the ion implantation from a point less than 0.3 μm away from the surface of the silicon substrate 10, with the impurity concentration of 5E16 atoms/$cm^3$ to 5E17 atoms/$cm^3$.

This method of manufacturing the solid-state imaging device 500 does not use epitaxial growth. The dark-current drain region 520 and the connection region 530 of the solid-state imaging device 500 are located at a small depth in the silicon substrate 10. Therefore, unlike the method of manufacturing the solid-state imaging device 100 shown in FIGS. 3A through 3C and 4A and 4B, it is unnecessary to take complicated steps of first forming the dark-current drain region and the connection region on the surface of the silicon substrate and then forming the epilayer 40a.

3. Effects

Since the floating diffusion 52 is surrounded by the element isolation region 51 and the dark-current drain region 520 and is completely separated from the silicon substrate 10, the dark current from the silicon substrate 10 is further prevented from entering the floating diffusion 52.

Also, since the connection region 530 can be formed large, the electric potential of the well region 540 can be stable.

[Modifications]

1. Steps of Manufacturing Dark-Current Drain Region and Connection Region

The steps of manufacturing the dark-current drain region and the connection region are not limited to those of the embodiments described above.

For example, according to the description above, when manufacturing the solid-state imaging device 100, the dark current drain material 20a is formed on the surface of the silicon substrate 10 as shown in FIG. 3B. However, the dark current drain material 20a may be formed within the silicon substrate 10 at a slight depth. If the dark current drain material 20a is layered within the silicon substrate 10, such a structure prevents the occurrence of crystal defects on the surface of the silicon substrate 10 at the formation of the epilayer 40a in the subsequent step, and accordingly prevents the occurrence of crystal defects within the epilayer 40a. The conditions for the ion implantation for layering the dark current drain material 20a within the silicon substrate 10 is that the acceleration energy is equal to or greater than 150 KeV for $P^+$ atomic ions, and is equal to or greater than 300 KeV for $As^+$ atomic ions.

Also, according to the description above, a resist is used for forming the connection region 30. Therefore, it is necessary to form the marks for photolithography on the silicon substrate 10 in advance. However, the step of forming the connection region 30 is performed after the step of forming the element isolation region 51, the making step will be unnecessary, because the marks and the element isolation region 51 can be formed at the same time in the step of forming the element isolation region 51. Therefore, it is preferable that the connection region 30 is formed after the formation of the element isolation region 51.

The following further describes modifications of the steps of forming the dark-current drain region 20 and the connection region 30 with reference to FIGS. 11 through 14.

(1) Manufacturing Method with Epitaxial Growth after Formation of Dark-Current Drain Region 20 and Connection Region 30

Figure 11A:
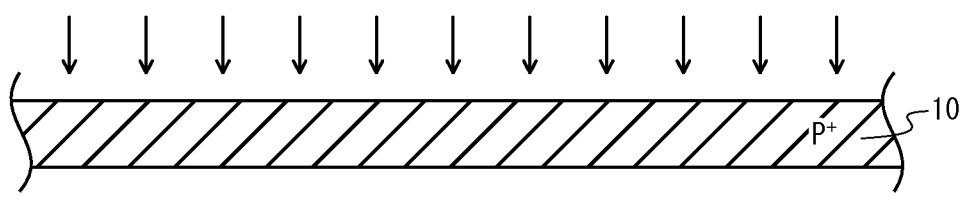
FIGS. 11A through 11C show steps for manufacturing the solid-state imaging device shown in FIGS. 1A and 1B.
Figure 11B:
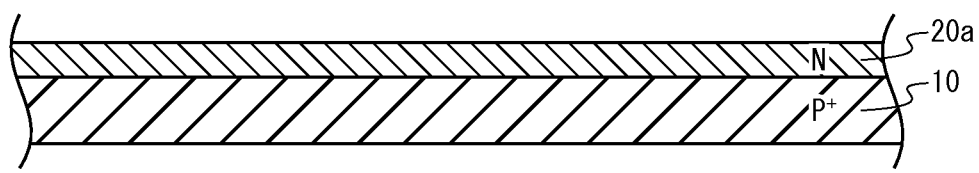

As shown in FIGS. 11A and 11B, N-type (second conductivity type) ion implantation is performed on the entire surface of the P-type (first conductivity type) silicon substrate 10, and a layer of the dark current drain material 20a composed of N-type (second conductivity type) impurities is formed. The details of the ion implantation are the same as shown in FIG. 3A and FIG. 3B.

Figure 11C:
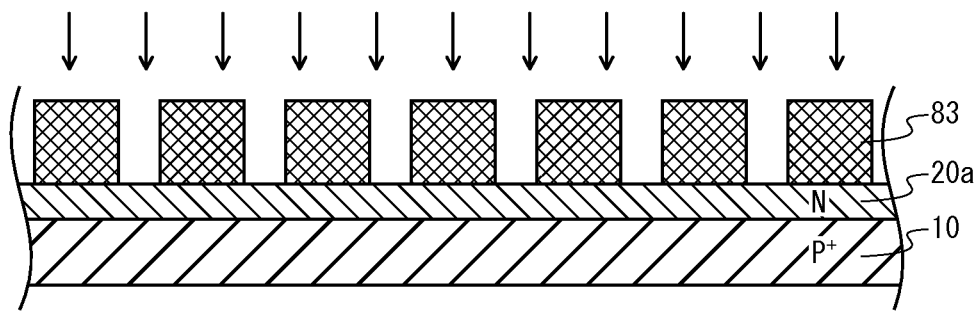

As shown in FIG. 11C, the resist 83 is formed on the dark current drain material 20a by a photolithography technology, and P-type (first conductivity type) ion implantation is performed with the use of the resist 83 as a mask. By the ion implantation, the dark-current drain region 20 and the connection region 30 are formed on the silicon substrate 10.

Figure 12A:
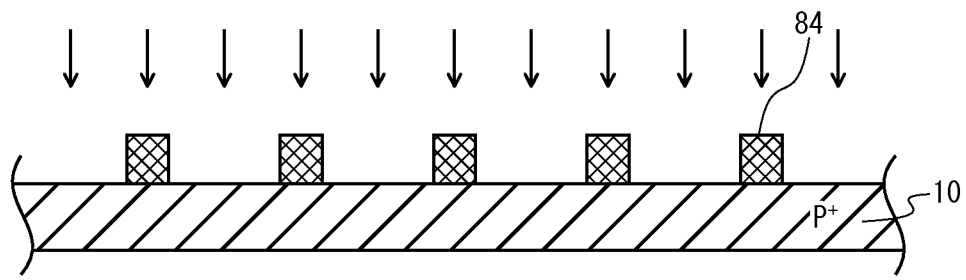
FIGS. 12A through 12C show steps for manufacturing the solid-state imaging device shown in FIGS. 1A and 1B.

(2) Manufacturing Method Using N-Type (Second Conductivity Type) and P-Type (First Conductivity Type) Ion Implantation with Mask As shown in FIG. 12A, the resist 84 is formed on the $P^+$-type (first conductivity type with a high concentration of impurities) silicon substrate 10 by a photolithography technology, and N-type (second conductivity type) ion implantation is performed with the use of the resist 84 as a mask. Specifically, the resist 84 is formed by a photolithography technology, and the ion implantation is performed with $P^+$ atomic ions at the acceleration energy of 170 KeV and the implantation amount of 1E12 atoms/$cm^2$ to 1E13 atoms/$cm^2$, for example. Before forming the resist 84, the step of forming the marks is necessary for photolithography.

Figure 12B:
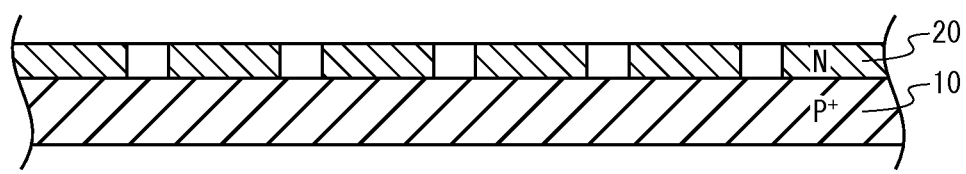

By the ion implantation described above, the dark-current drain region 20 is formed as shown in FIG. 12B. Since the resist 84 serves as a mask, the region where the connection region 30 is to be formed is not subject to the ion implantation.

Figure 12C:
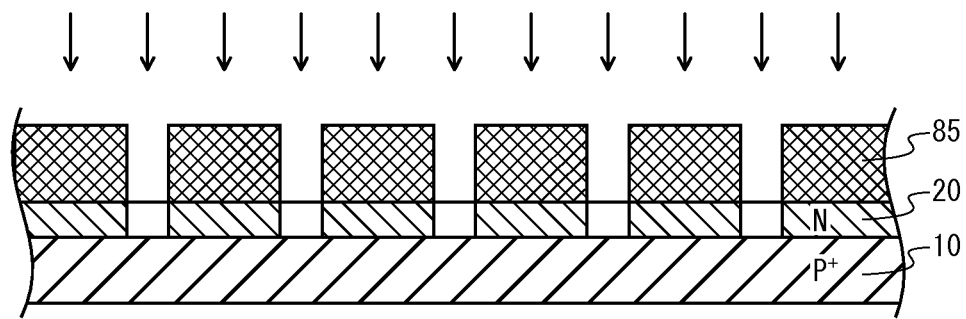

As shown in FIG. 12C, the resist 85 is formed on the silicon substrate 10 by a photolithography technology, and P-type (first conductivity type) impurity ion implantation is performed with the use of the resist 85 as a mask. Specifically, in the case of ion implantation with B+ atomic ions, the acceleration energy is set to 50 KeV, and the implantation amount is set to 1E12 atoms/$cm^2$ to 1E13 atoms/$cm^2$, for example. Under these conditions, the connection region 30 as an impurity layer is formed slightly away from the surface of the silicon substrate 10. By the ion implantation, the dark-current drain region 20 and the connection region 30 are formed on the silicon substrate 10. Subsequently, the epilayer 40a, which is not depicted in the drawing, is formed on the dark-current drain region 20 and the connection region 30 by causing epitaxial growth.

According to this method, the connection region 30 is formed before causing the epitaxial growth. Therefore, the connection region 30 can be formed by ion implantation at lower acceleration energy than the case shown in FIG. 3. Therefore, this method does not need a high acceleration ion implantation apparatus.

(3) Manufacturing Method without Using Epitaxial Growth

Figure 13A:
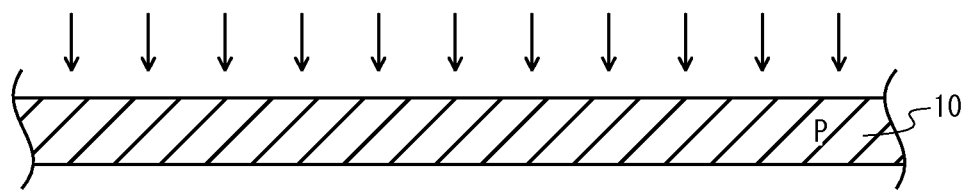
FIGS. 13A through 13C show steps for manufacturing the solid-state imaging device shown in FIGS. 1A and 1B.

As shown in FIG. 13A, N-type (second conductivity type) impurity ion implantation is performed on the entire surface of the P-type (first conductivity type) silicon substrate 10. Specifically, the ion implantation is performed with $P^+$ ions, for example. Unlike the case shown in FIG. 3C, the epilayer 40a is not formed. Therefore, the impurity ions are implanted at a depth of 2.5 μm to 5 μm from the surface of the silicon substrate 10 with high acceleration energy. For this purpose, a high acceleration ion implantation apparatus is necessary. Specifically, for implanting $P^+$ ions at a depth of 3 μm from the surface of silicon substrate 10, the acceleration energy needs to be at least 4.7 MeV.

Figure 13B:
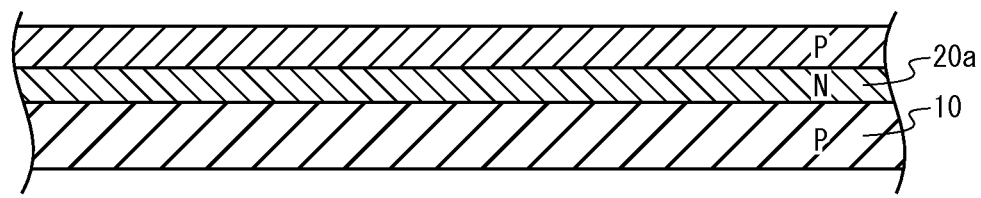

By the ion implantation described above, the dark-current drain material 20a is formed as shown in FIG. 13B.

Figure 13C:
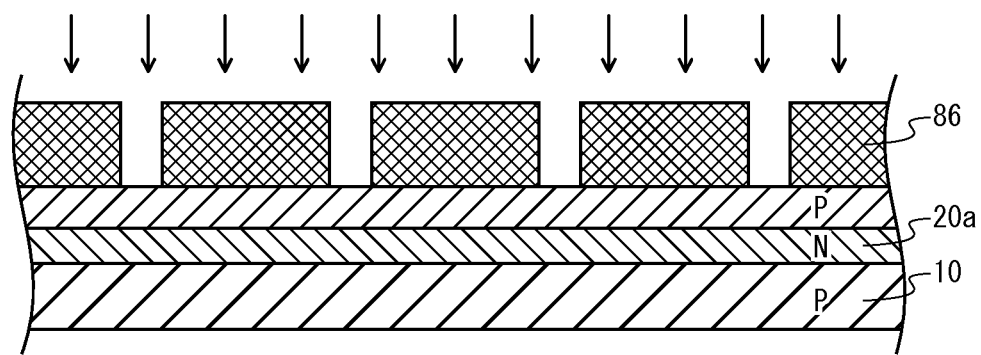

As shown in FIG. 13C, the resist 86 is formed by a photolithography technology, and P-type (first conductivity type) impurity ion implantation is performed with the use of the resist 86 as a mask. Thus, the dark-current drain region 20 and the connection region 30 are formed on the silicon substrate 10.

Figure 14A:
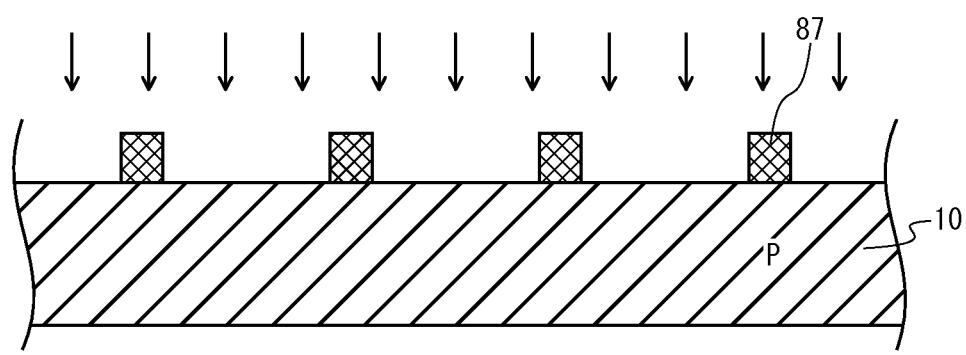
FIGS. 14A and 14B show steps for manufacturing the solid-state imaging device shown in FIGS. 1A and 1B.

(4) Method of Forming Well Region 40 without Using Epitaxial Growth and Forming Connection Region 30 without Performing P-Type Ion Implantation As shown in FIG. 14A, the resist 87 is formed by a photolithography technology, and N-type (second conductivity type) impurity ion implantation is performed with the use of the resist 87 as a mask.

Figure 14B:
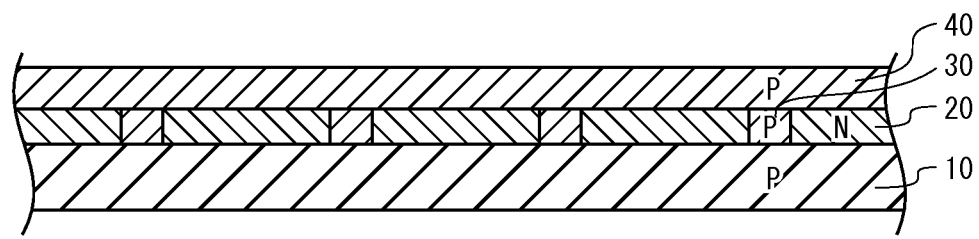

By the ion implantation described above, the N-type (second conductivity type) dark-current drain region 20 and the P-type (first conductivity type) connection region 30 are formed as shown in FIG. 14B. The P-type (first conductivity type) connection region 30 is formed because the resist 87 serves as a mask. The region where the ion implantation is not performed remains as a P-type (first conductivity type) region.

According to this method, it is unnecessary to perform P-type (first conductivity type) ion implantation for forming the connection region 30. Therefore, it is possible to omit the step of performing the P-type (first conductivity type) ion implantation, and reduce the number of the required steps.

2. Other Manufacturing Methods

According to Embodiment 1, the element isolation region 51, the well region 40, the transistors within the pixel, and the photodiode 50 are formed after forming the dark-current drain region 20 and the connection region 30. However, the present invention is not limited in this way. The connection region 30 may be formed after forming all or part of: the element isolation region 51; the well region 40; the transistors within the pixel (by ion implementation for setting the threshold voltage at Vth); and the photodiode 50.

3. Modification Examples of Layout of Connection Region

Figure 15A:
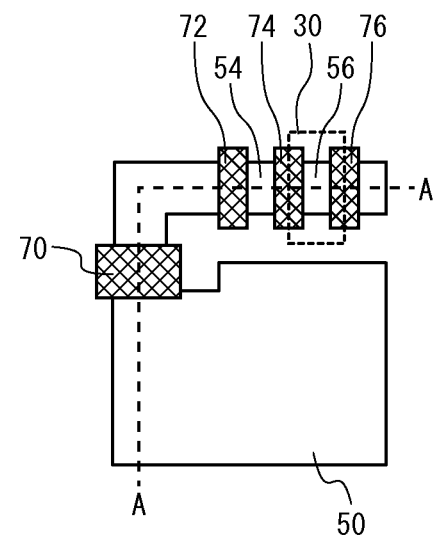
FIGS. 15A through 15C are layout diagrams showing modification examples of the positional relationship between the transistors and the connection region of the solid-state imaging device shown in FIGS. 1A and 1B.
Figure 15B:
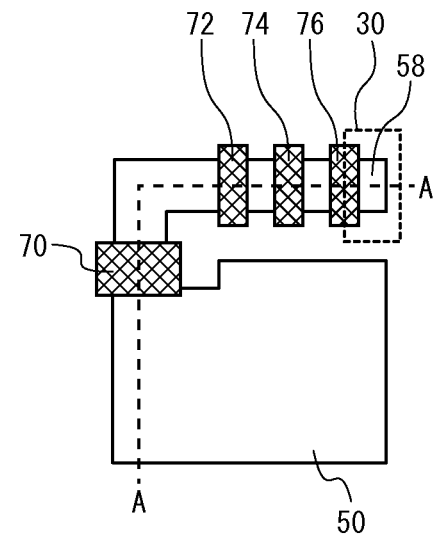
Figure 15C:
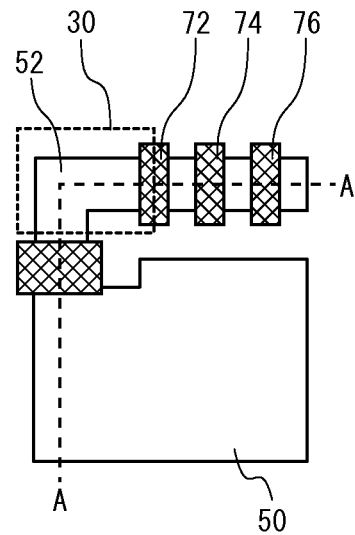
Figure 16:
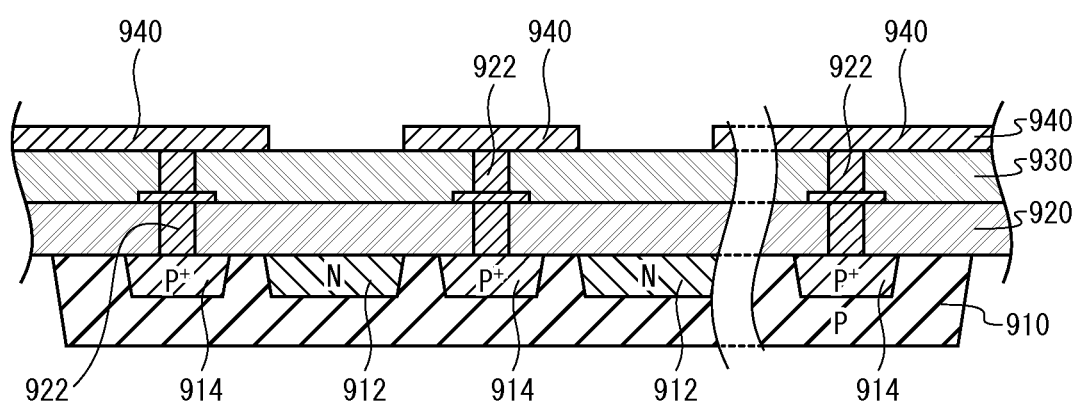
FIG. 16 shows the structure of a conventional solid-state imaging device.

The layout of the connection region is not limited to the layouts pertaining to the embodiments described above. FIGS. 15A through 15C are layout diagrams showing modification examples of the location of the connection region 30 in the solid-state imaging device 100.

As shown in FIG. 15A, the connection region 30 may be located to surround the junction region 56. The junction region 56 serves as the source of the amplifying transistor and the drain of the select transistor. In other words, when seen from above, the connection region 30 may overlap at least part of the amplifying transistor or the select transistor. In the solid-state imaging device 100, the period for which the photodiode 50 accumulates signals is a long period, and the period for which signals are not read is short. During the period for which signals are not read, the gate of the select transistor is off. Therefore, the junction region 56 has a relatively high electric potential for a long period. Here, the "relatively high" means that the electric potential is close to the electric potential of the power supply voltage which is equal to the electric potential of the junction region 54. Since the junction region 56 with such a property is likely to absorb the dark current, it is possible to suppress the dark current flowing from the silicon substrate 10 to the connection region 30 by forming the connection region 30 to surround the junction region 56.

As shown in FIG. 15B, the connection region 30 may be located to surround the junction region 58. The junction region 58 serves as the source of the select transistor, and is connected to the signal wiring line used for reading signals from the amplifying transistor. Therefore, during the signal reading period, the junction region 58 is maintained at the electric potential corresponding to the pixel signal, and also during non-signal reading period, the junction region 58 is maintained at an appropriate high electric potential. Since the junction region 58 with such a property is likely to absorb the dark current, it is possible to suppress the dark current flowing from the silicon substrate 10 to the connection region 30 by forming the connection region 30 to surround the junction region 58.

As shown in FIG. 15C, the connection region 30 may be located to surround the floating diffusion 52. The electric potential of the floating diffusion 52 is reset to the electric potential of the power supply voltage by the reset transistor, and is maintained at the electric potential until signal charge is read from the photodiode 50. Since the floating diffusion 52 with such a property is likely to absorb the dark current, it is possible to suppress the dark current flowing from the silicon substrate 10 to the connection region 30 by forming the connection region 30 to surround the floating diffusion 52.

However, when the connection region 30 is located as shown in FIG. 15C, it is necessary to take care of the following points. As described above, the floating diffusion 52 temporarily accumulates signal charge from the photodiode 50. If the floating diffusion 52 accumulates dark current flowing from the silicon substrate 10 to the connection region 30 during the accumulation period, the dark current could cause noise. For this reason, when the connection region 30 is located as shown in FIG. 15C, it is necessary to set the floating diffusion 52 such as to accumulate signal charge only for a short period, and suppress the influence of the noise.

4. Supplemental Descriptions

The structures of the well regions pertaining to Embodiment 5 may be applied to the solid-state imaging device pertaining to Embodiment 3. If this is the case, the floating diffusion, which serves as the drain region of the read transistor, may be surrounded by the element isolation region and the dark current region.

In the description above, it is assumed that the first conductivity type is the P-type and the second conductivity type is the N-type. However, it is of course possible that the first conductivity type is the N-type and the second conductivity type is the P-type.

The structure of the solid-state imaging device pertaining to the present disclosure is not limited to those of the embodiments and the modification examples described above. The present invention may be applied with various modifications within the scope of the advantageous effects. Also, within the scope of the technical idea of the present disclosure, any of the steps described above may be replaced with other alternative steps. Furthermore, the order of the steps and the materials used in the steps may be changed.

INDUSTRIAL APPLICABILITY

The present disclosure is applicable to solid-state imaging devices for digital still cameras, digital video cameras, surveillance cameras, car-mounted cameras, and so on.

REFERENCE SIGNS LIST 10, 910: Silicon substrate
20, 220, 222, 224, 520: Dark-current drain region
30: Connection region
50, 912: Photodiode
52: Floating diffusion
60: Gate oxide film
90, 920, 930: Insulating film
92: Connection layer
94: Lower electrode
96: Photoelectric conversion film
98: Upper electrode
100, 200, 300, 400, 500, 900: Solid-state imaging device

The invention claimed is:
1. A solid-state imaging device comprising:
a photoelectric converter generating charge by photoelectric conversion, and a semiconductor substrate having a first surface and a second surface opposite to the first surface, the second surface facing the photoelectric converter, the semiconductor substrate including:
  a base region of a first conductivity type, on a side of the first surface, having a fixed electric potential;
  a well region of the first conductivity type, on a side of the second surface;
  a first region of a second conductivity type, between the base region and the well region;
  a connection region of the first conductivity type, between the base region and the well region, electrically connecting the base region and the well region to maintain the well region at the fixed electric potential; and
  a floating diffusion in the well region, electrically connected to the photoelectric converter, for accumulating the charge, wherein
the first region overlaps the floating diffusion in plan view.

2. The solid-state imaging device of claim 1 further comprising:
  a second region within the well region, the second region in combination with the floating diffusion constituting a part of a reset transistor that resets an electric potential of the floating diffusion, the floating diffusion being one of a source and a drain of the reset transistor, the second region being the other one of the source and the drain of the reset transistor, wherein
the connection region overlaps at least a portion of the reset transistor in plan view.

3. The solid-state imaging device of claim 2, wherein the connection region overlaps no portion of the first region in plan view.

4. The solid-state imaging device of claim 1, wherein
the well region has a third surface and a fourth surface opposite to the third surface, the fourth surface facing the photoelectric converter and being the second surface of the semiconductor substrate,
the first region has a fifth surface and a sixth surface opposite to the fifth surface, the sixth surface being in direct contact with the third surface,
a distance between the fourth surface and the sixth surface falls within a range of 2.5 μm to 5 μm.

5. The solid-state imaging device of claim 1, wherein
the well region has a third surface and a fourth surface opposite to the third surface, the fourth surface facing the photoelectric converter and being the second surface of the semiconductor substrate,
the first region has a fifth surface and a sixth surface opposite to the fifth surface, the sixth surface being in direct contact with the third surface,
a distance between the fourth surface and the sixth surface falls within a range of 0.3 μm to 1 μm.

6. The solid-state imaging device of claim 1 further comprising:
  a second region and a third region located within the well region and constituting a part of an amplifying transistor that amplifies a signal according to the charge, the second region and the third region respectively being a source and a drain of the amplifying transistor, respectively, wherein
the connection region overlaps at least a portion of the amplifying transistor in plan view.

7. The solid-state imaging device of claim 6, wherein the connection region overlaps no portion of the first region in plan view.

8. The solid-state imaging device of claim 1 further comprising:
  a second region and a third region located within the well region and constituting a part of a select transistor that provides an instruction indicating whether or not to read an amplified signal, the second region and the third region respectively serving as a source and a drain of the select transistor, wherein
the connection region overlaps at least a portion of the select transistor in plan view.

9. The solid-state imaging device of claim 8, wherein the connection region overlaps no portion of the first region in plan view.

10. The solid-state imaging device of claim 1, wherein the photoelectric converter comprises:
  a first electrode over the well region;
  a second electrode over the first electrode; and
  a photoelectric conversion film, between the first electrode and the second electrode.

11. The solid-state imaging device of claim 1, wherein the connection region overlaps no portion of the floating diffusion in plan view.

12. The solid-state imaging device of claim 11, wherein the connection region overlaps no portion of the first region in plan view.

* * * * *